(12) United States Patent
Lee et al.

(10) Patent No.: US 11,894,050 B2
(45) Date of Patent: Feb. 6, 2024

(54) MEMORY WITH A SENSE AMPLIFIER ISOLATION SCHEME FOR ENHANCING MEMORY READ BANDWIDTH

(71) Applicant: QUALCOMM Incorporated, San Diego, CA (US)

(72) Inventors: Hochul Lee, Los Angeles, CA (US); Anil Chowdary Kota, San Diego, CA (US); Dhvani Sheth, San Diego, CA (US); Chulmin Jung, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 203 days.

(21) Appl. No.: 17/481,601

(22) Filed: Sep. 22, 2021

(65) Prior Publication Data

US 2023/0087277 A1    Mar. 23, 2023

(51) Int. Cl.
  *G11C 11/419* (2006.01)
  *G11C 11/412* (2006.01)

(52) U.S. Cl.
  CPC .......... *G11C 11/419* (2013.01); *G11C 11/412* (2013.01)

(58) Field of Classification Search
  CPC .... G11C 11/412; G11C 11/418; G11C 11/419
  USPC ........................................................ 365/203
  See application file for complete search history.

(56) References Cited

U.S. PATENT DOCUMENTS

| 6,324,110 | B1 * | 11/2001 | Leung ................. | G11C 7/1069 |
| | | | | 365/207 |
| 2008/0037338 | A1 * | 2/2008 | Chen ..................... | G11C 7/14 |
| | | | | 365/194 |
| 2013/0070538 | A1 * | 3/2013 | Sugamoto ............ | G11C 7/12 |
| | | | | 365/210.1 |
| 2020/0388327 | A1 | 12/2020 | Nguyen et al. | |
| 2020/0388328 | A1 | 12/2020 | Jung et al. | |

FOREIGN PATENT DOCUMENTS

| WO | 2018175093 A1 | 9/2018 |
| WO | 2021021507 A1 | 2/2021 |

OTHER PUBLICATIONS

International Search Report and Written Opinion—PCT/US2022/042961—ISA/EPO—dated Dec. 14, 2022.

* cited by examiner

*Primary Examiner* — Sung Il Cho
(74) *Attorney, Agent, or Firm* — Haynes and Boone, LLP

(57) ABSTRACT

A memory is provided that includes a self-timed memory circuit that controls the isolation of a sense amplifier from a column selected by a column multiplexer until the completion of a bit line voltage difference development delay. The self-timed memory circuit also controls the release of a pre-charge for the sense amplifier responsive to the completion of the bit line voltage difference development delay.

15 Claims, 8 Drawing Sheets

MEMORY WITH A SENSE AMPLIFIER ISOLATION SCHEME FOR ENHANCING MEMORY READ BANDWIDTH

TECHNICAL FIELD

This application relates to memories, and more particularly to a sense amplifier isolation technique to enhance memory read bandwidth.

BACKGROUND

The bitcells in a static random-access memory (SRAM) are arranged into rows and columns. A row is accessed by asserting the voltage of the corresponding row word line. With the word line voltage asserted, a sense amplifier for a column of bitcells that intersects the accessed row may make a bit decision. Each column has a bit line pair formed by a bit line and a complement bit line. Before the read operation, the bit line pair is pre-charged. With the word line to the accessed row being asserted, one of the bit lines in the bit line pair will begin discharging depending upon the binary value of a stored bit in a bitcell at the intersection of the accessed row and column.

When a sufficient voltage difference has developed between the bit lines, a sense amplifier may then make a bit decision for the read operation. To enhance operating speed, the bit line voltage difference is not full rail (not being equal to the power supply voltage) but instead is a fraction of the power supply voltage. For example, if the power supply voltage is approximately 1 V, a sufficient bit line voltage difference may be approximately 200 mV or even less. The sense amplifier requires gain to amplify the bit line voltage difference into a full rail bit decision (a binary one or a binary zero) for the read operation. The resulting sense amplifier footprint may then be too large to fit within the column pitch of modern high-density memories. It is thus conventional to multiplex a group of columns to a single sense amplifier through a column multiplexer.

During a read operation, the timing of the bit line pre-charging, the assertion and subsequent release of the word line, the pre-charging of the sense amplifier, and the enabling of the sense amplifier are all controlled by self-timed clock signals. For example, it is conventional during the beginning of a read operation that the sense amplifier and the bit lines are pre-charged. The pre-charging is then stopped, the column multiplexer is opened, and the word line is asserted. After a suitable bit line voltage difference development delay to allow the bit line voltage difference to develop, the word line is closed, and the sense amplifier enabled to make its bit decision. The sense amplifier must then be pre-charged again to start another read operation cycle. But as the memory operating speed is increased, the margin for the sense amplifier pre-charging shrinks. If the sense amplifier is not properly pre-charged, the read operation may result in an erroneous bit decision.

SUMMARY

In accordance with an aspect of the disclosure, a memory is provided that includes: a sense amplifier configured to pre-charge a pair of sense amplifier input nodes responsive to an assertion of a sense amplifier pre-charge signal; and a self-timed memory circuit including a dummy bit line circuit configured to assert a dummy bit line output signal to trigger a de-assertion of the sense amplifier pre-charge signal.

In accordance with another aspect of the disclosure, a method of a read operation to a memory is provided that includes: beginning a word line assertion delay responsive to an assertion of a memory clock signal; beginning a bit line voltage difference development delay responsive to a completion of the word line assertion delay; stopping a pre-charge of a pair of input nodes to a sense amplifier responsive to a completion of the bit line voltage difference development delay; and opening a read column multiplexer to couple a pair of bit lines to the pair of input nodes responsive to the completion of the bit line voltage difference development delay.

In accordance with yet another aspect of the disclosure, a memory is provided that includes: a plurality of columns, each column in the plurality of columns including a pair of bit lines; a sense amplifier including a pair of sense amplifier input nodes; a read column multiplexer configured to select a selected column from the plurality of columns responsive to an assertion of a read multiplexer address signal to couple the pair of bit lines in the selected column to the pair of sense amplifier input nodes; and a self-timed memory circuit configured to prevent the assertion of the read multiplexer address signal until a completion of a bit line voltage difference development delay.

These and additional advantages may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
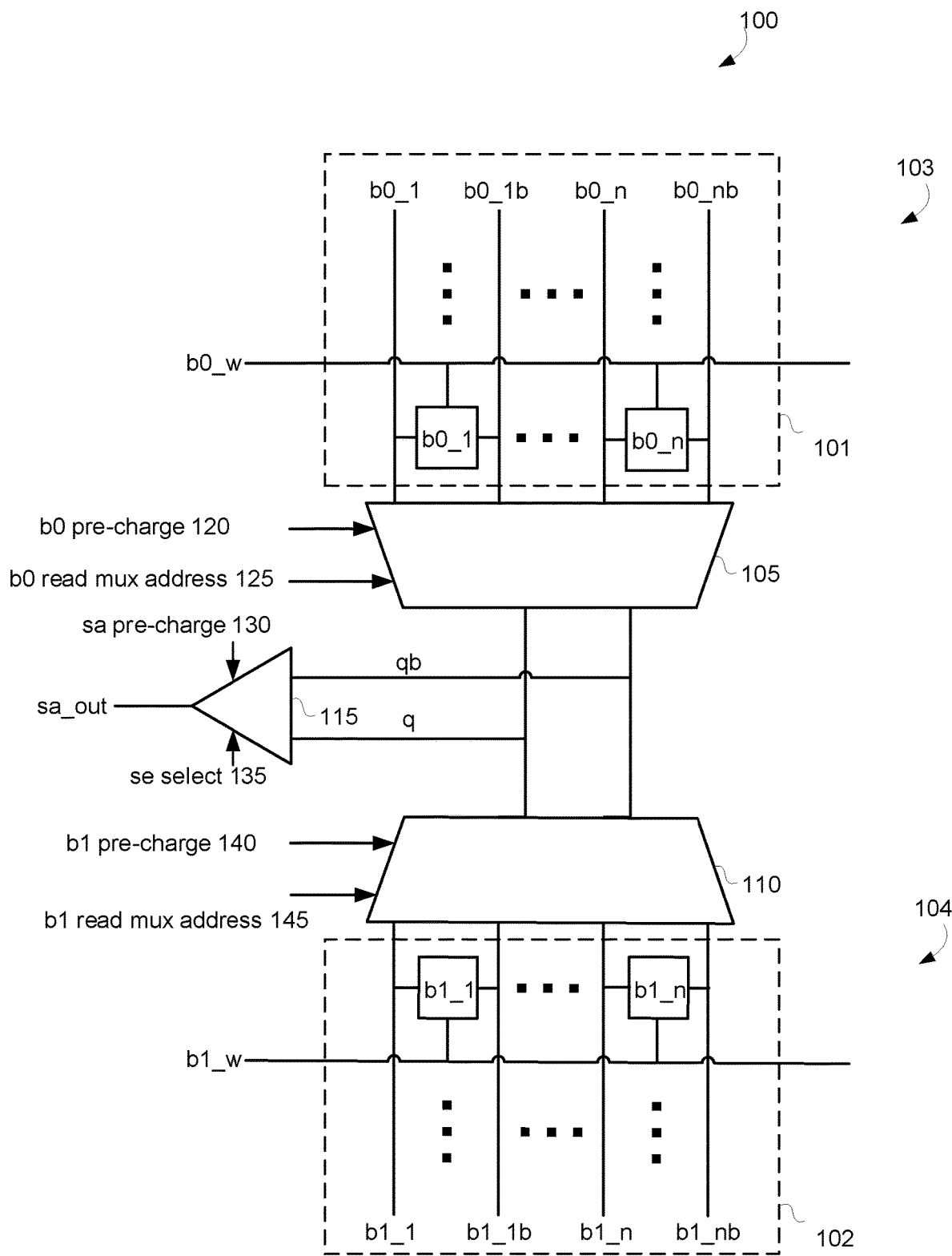
FIG. 1 illustrates a self-timed memory in accordance with an aspect of the disclosure.

A static random-access memory (SRAM) is provided with improved self-timing to control a read operation so as to advantageously increase the memory read bandwidth. An example SRAM 100 with this improved self-timing is shown in FIG. 1. In SRAM 100, a column multiplexer 105 multiplexes a column group 101 of columns for a zeroth bank 103 to a pair of sense amplifier input nodes q and qb for a sense amplifier 115. Similarly, a column multiplexer 110 multiplexes a column group 102 of columns for a first bank 104 to the sense amplifier input nodes q and qb. Each group of columns ranges from a first column to an nth column, n being a plural positive integer. For example, if n equals 2, each column group has two columns. Similarly, if n equals 4, each column group has four columns, and so on.

Each column includes a bit line and a complement bit line. For example, column group 101 for bank 0 ranges from a first column having a bit line b0_1 and a complement bit line b0_1b to an nth column having a bit line b0_n and a complement bit line b0_nb. Each column includes a plurality of bitcells. Across the columns, the bitcells are also arranged in rows. Each row of bitcells is traversed by a corresponding word line. For illustration clarity, only a single word line b0_w is shown in zeroth bank 103. When word line b0_w is asserted, all the bit cells in the corresponding row drive their column's bit lines responsive to the binary content of each bitcell. There is a bitcell at the intersection of each word line and column in zeroth bank 103. For illustration clarity, only a first bitcell b0_1 and an nth bitcell b0_n are shown in FIG. 1 for column group 101 in the row traversed by word line b0_w.

Column group 102 in first bank 104 is arranged analogously. Column group 102 thus ranges from a first column having a bit line b1_1 and a complement bit line b1_1b to an nth column having a bit line b1_n and a complement bit line b1_nb. Each column includes a plurality of bitcells. Across the columns in first bank 104, the bitcells are also arranged in rows. Each row of bitcells is traversed by a corresponding word line. For illustration clarity, only a single word line b1_w is shown in first bank 104. When word line b1_w is asserted, all the bit cells in the corresponding row drive their column's bit lines responsive to the binary content of each bitcell. There is a bitcell at the intersection of each word line and column in first bank 104. For illustration clarity, only a first bitcell b1_1 and an nth bitcell b1_n are shown in FIG. 1 for column group 102 in the row traversed by word line b1_w.

As used herein a "bank" refers to an array of bitcells that shares a plurality of columns. The plurality of columns are further arranged into column groups such as a column groups 101 and 102. It is conventional to split a memory array into banks such as zeroth bank 103 and first bank 104 because if a bit line traverses too many rows of bitcells, the bit line capacitance becomes too large. The large bit line capacitance then requires a lengthy read operation so that a sufficient bit line voltage difference for a successful bit decision may be developed. For example, if zeroth bank 103 and first bank 104 were combined into a single bank having the same number of columns, the bit line capacitance would be approximately doubled.

Each bank is addressed by its own set of addresses. For example, a read to column group 101 in zeroth bank 103 involves a zeroth bank address that commands column multiplexer 105 to select for the ith column in column group 101, i being an integer ranging from 1 to n. Since each column multiplexer may also be denoted as a read multiplexer (mux), the zeroth bank address may also be denoted as a b0 read mux address 125, which may be an active-low address. With the b0 read mux address 125 asserted, the bit line in the selected column couples through column multiplexer 105 to the q input node of sense amplifier 115. Similarly, the complement bit line in the selected column couples through column multiplexer 105 to the complement input node qb of sense amplifier 115. A similar column addressing occurs in column multiplexer 110 in first bank 104 responsive to an assertion of a b1 read mux address b1_rm[i] 145.

Prior to the read operation, the addressed bank pre-charges its bit lines. Each column in SRAM 100 is configured to pre-charge its bit lines responsive to a corresponding pre-charge signal. For conceptual purposes, an active-low bank 0 pre-charge signal (b0 pre-charge) 120 is shown being received by column multiplexer 105 instead of each column's pre-charge circuit. As defined herein, a signal is deemed to be "asserted" when that signal is true, regardless of whether the true state is expressed as active-high or active-low. Should the b0 pre-charge signal 120 be active-low, it is asserted by being discharged. In response, the columns in zeroth bank 103 pre-charge their bit lines. In contrast, an active-high signal is asserted by being charged to a power supply voltage. Similarly, the columns in first bank 104 pre-charge their bit lines responsive to an assertion of a first bank pre-charge (b1 pre-charge) signal 140, which may be an active-low signal.

Sense amplifier 115 responds to an assertion of a sense amplifier pre-charge (sa pre-charge) signal 130 by pre-charging the sense amplifier input nodes q and qb. In response to an assertion of a sense enable signal that may also be denoted as a sense select (se select) signal 135, sense amplifier 115 senses the bit line voltage difference across its input nodes q and qb to form a bit decision output signal sa_out.

Figure 2:
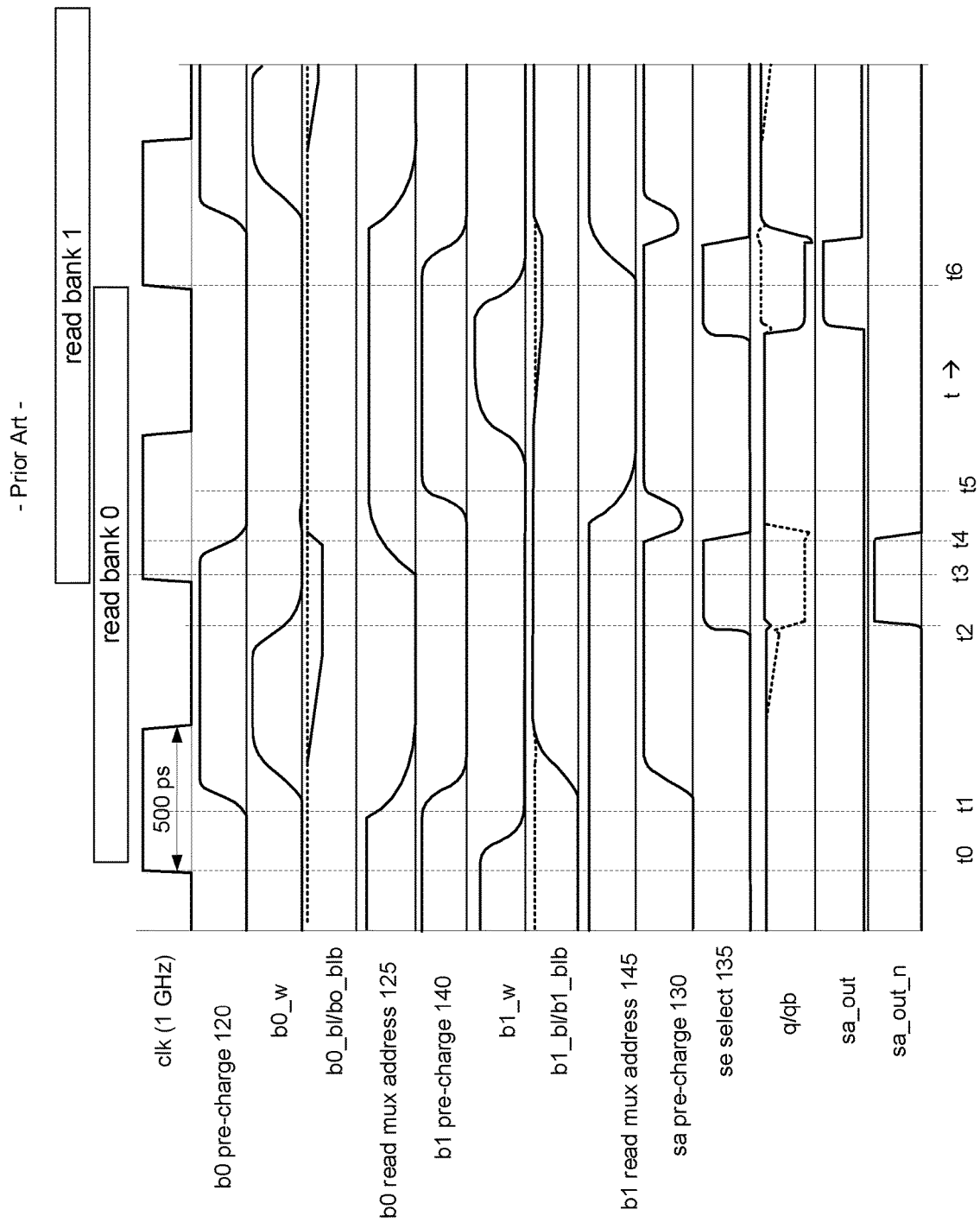
FIG. 2 illustrates some waveforms for a conventional self-timed memory.

To provide a better appreciation of this advantageous self-timing, a traditional self-timing will first be discussed as if SRAM 100 were conventionally self-timed. Some operating waveforms for such conventional self-timing are shown in FIG. 2. Read operations to the zeroth bank 103 and to the first bank 104 occur responsive to cycle of a memory clock signal (clk) that cycles according to a 1 GHz rate. Each cycle or period of the memory clock signal is thus 1000 pico-seconds long. A first clock cycle begins at a time t0 for a read to the zeroth bank 103. Initially, the active-low b0 pre-charge signal 120 is asserted by being discharged so that the bit lines in the zeroth bank 103 are pre-charged. Similarly, the active-low sense amplifier pre-charge (sa pre-charge) signal 130 is also initially asserted. After an initial delay, the b0 read mux address 125 is asserted at a time t1 by being discharged and the zeroth bank word line b0_w asserted. Both the b0 pre-charge signal 120 and the sa pre-charge signal 130 are de-asserted by being charged to the power supply voltage at approximately the same time t1 as when the b0 read mux address 125 is asserted. A bit line voltage difference b0_b1//b0_b1b in the addressed column develops due to the bit lines in the addressed column coupling to the accessed bitcell in response to the assertion of the voltage of the word line b0_w.

The assertion of the b0 read mux address 125 causes the bit line voltage difference to couple to the sense amplifier input nodes q and qb as a voltage difference q/qb. Once this voltage difference q/qb has developed sufficiently, the sense amplifier select (se select) 135 is asserted at a time t2 so that a sense amplifier bit decision signal sa_out and its complement sa_out_n may be produced by sense amplifier 115. The word line b0_w is released at approximately time t2.

A new clock cycle begins at a time t3 with a read operation to the first bank 104. The b1 pre-charge signal 140 was already asserted prior to time t3 so the bank 1 bit lines are already pre-charged. But due to the sharing of sense amplifier 115 by the two banks, the sa pre-charge signal 130 cannot be asserted until the sense amplifier bit decision sa_out and its complement sa_out_n can be latched in a global output latch (not illustrated). This latching does not occur until approximately a time t4. As a result, the sense amplifier pre-charging for the bank 1 read operation may not have a sufficiently long duration. A bit error may then occur. For example, the b1 read mux address 145 may be asserted along with an assertion of the bank one word line b1_w following time t4. A bit line voltage difference b1_b1/b1_b1b develops. But this bit line voltage difference may not couple properly to the sense amplifier input nodes q and qb during the bank 1 read operation due to the shortened sense amplifier pre-charge duration ending at a time t5. Another memory clock cycle begins at a time t6.

Figure 3:
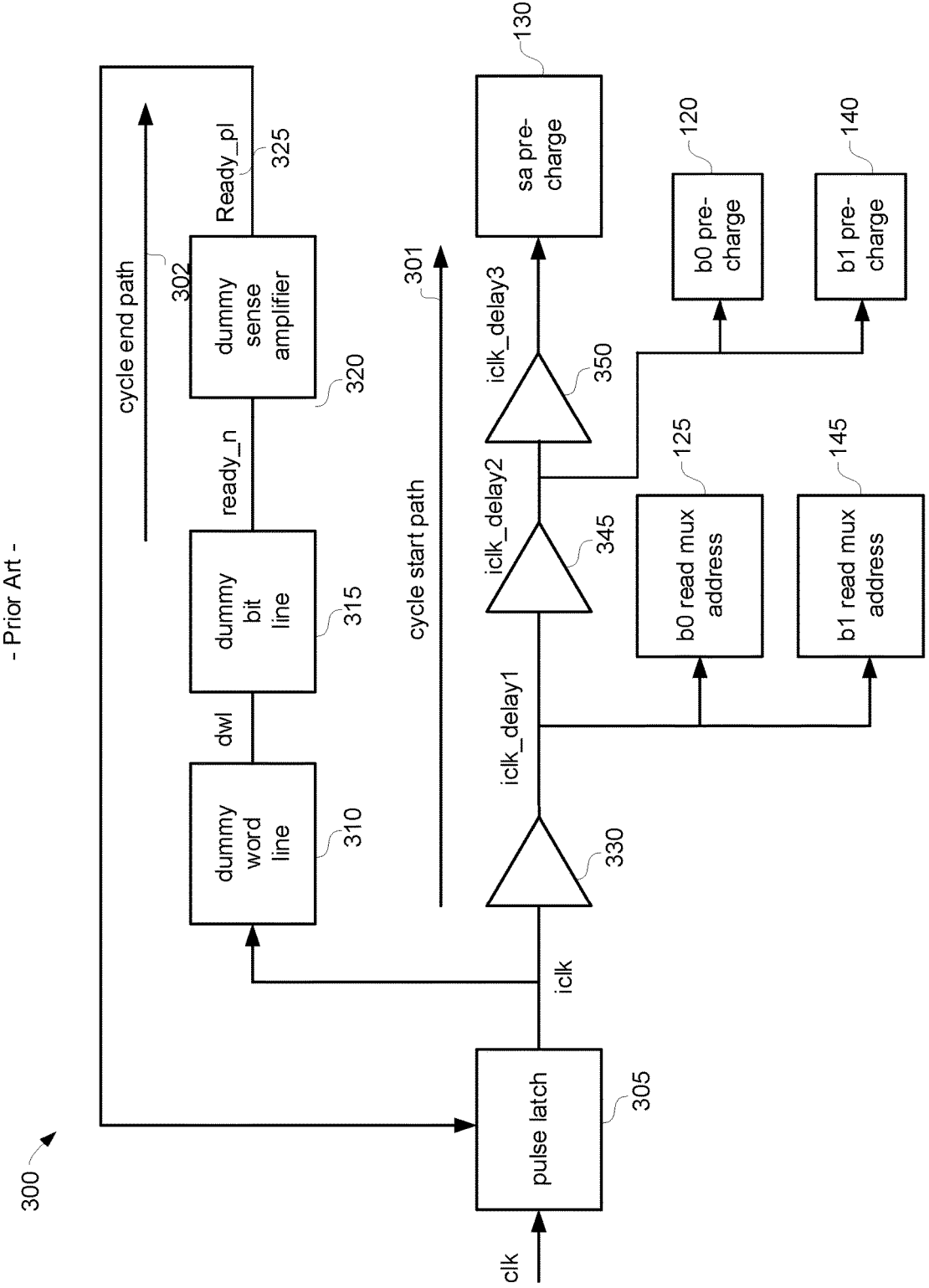
FIG. 3 illustrates a conventional self-timed memory circuit for the self-timing of a self-timed memory.

The potential flaws of the conventional self-timed operation discussed with regard to FIG. 2 may be better appreciated by a consideration of a conventional self-timed memory circuit 300 as shown in FIG. 3 that controls this self-timed operation. Self-timed memory circuit 300 include a pulse latch 305 that latches the memory clock signal (clk). Such latching of the memory clock signal clk is conventional to produce an internal clock (iclk) signal. Pulse latch 305 asserts the iclk signal in response to an assertion (e.g., a rising edge) of the memory clock signal. Self-timed memory circuit 300 includes a cycle start path 301 that controls the timing of sa pre-charge signal 130, b0 pre-charge signal 120, b1 pre_charge signal 140, b0 read mux address 125, and b1 read mux address 145.

In cycle start path 301, a buffer 330 delays the iclk signal to create a first delayed internal clock (iclk_delay1) signal. The iclk_delay1 signal will thus be asserted shortly after the assertion of the iclk signal, which in turn is in response to the assertion of the memory clock signal. The assertion of the iclk_delay1 signal controls the assertion of either b0 read mux address 125 or b1 read mux address 145, depending upon which bank is being addressed.

Cycle start path 301 also includes a buffer 345 that delays the iclk_delay1 signal to form a second delayed internal clock (iclk_delay2) signal. The assertion of the iclk_delay2 signal controls the release (de-assertion) of the b0 pre-charge signal 120 or the b1 pre-charge signal 140 depending upon which bank is being addressed.

Finally, cycle start path 301 includes a buffer 350 that delays the iclk_delay2 signal into a third delayed internal clock (iclk_delay3) signal. The assertion of the iclk_delay3 signal controls the release (de-assertion) of the sa pre-charge signal 130.

Cycle start path 301 is deemed to be a "start" path because it is used to trigger the word line assertion and other initial actions in a read operation. The iclk_delay1 signal, the iclk_delay2 signal, and the iclk_delay3 signal are all delayed versions of the iclk signal, which in turn is delayed by the latching in pulse latch 305 with respect to the memory clock signal. A rising edge (a transition from ground to the power supply voltage) of the memory clock signal will thus produce a rising edge in the iclk signal, followed by a rising edge in the iclk_delay1 signal, then a rising edge in the iclk_delay2 signal, and finally by a rising edge in the iclk_delay3 signal. The delays introduced by buffers 330, 345, and 350 are fixed and do not depend on the completion of operations in SRAM 100.

In contrast to the cycle start path 301, a cycle end path 302 in self-timed memory circuit 300 self-times various functions of a read operation. For example, cycle end path 302 includes a dummy word line circuit 310 that mimics the delay necessary to develop the word line voltage. In response to an assertion of the internal clock signal iclk, dummy word line circuit 310 will assert a dummy word line output signal (dw1) after a simulated word line voltage development delay. A dummy bit line circuit 315 mimics the bit line voltage difference development delay for the development of a sufficient bit line voltage difference in the addressed column. In response to an assertion of the dw1 output signal from dummy word line circuit 310, dummy bit line circuit 315 asserts a dummy bit line output signal (ready_n) after the simulated bit line voltage difference development delay is completed. A dummy sense amplifier circuit 320 responds to the assertion of the ready_n output signal from dummy bit line circuit 315 by simulating a delay necessary to complete a bit decision by sense amplifier 115. After this simulated sense amplifier sensing delay, dummy sense amplifier circuit 320 triggers an assertion of the se select signal 135 and triggers an assertion of a ready_p1 signal 325 that causes pulse latch 305 to reset the internal clock signal iclk. The falling edge of the internal clock signal iclk is thus independent of the falling edge of the memory clock signal but instead depends on the self-timed behavior of cycle end path 302 in self-timed memory circuit 300.

But note the problem with tying the assertion of the b0 read mux address signal 125, the assertion of the b1 read mux address signal 145, and the release of the sa pre-charge signal 130 to the cycle start path 301. Referring again to FIG. 2, note that the b1 read mux address signal 145 is asserted shortly after time t4, which is relatively early into the bank 1 read cycle. The sa pre-charge signal 130 must thus be released shortly after time t4 at time t5. The sense amplifier pre-charge time for the bank 1 read operation thus only extends from approximately time t4 to time t5, which may not provide a sufficient margin for the pre-charging of the sense amplifier input nodes q and qb.

Figure 4:
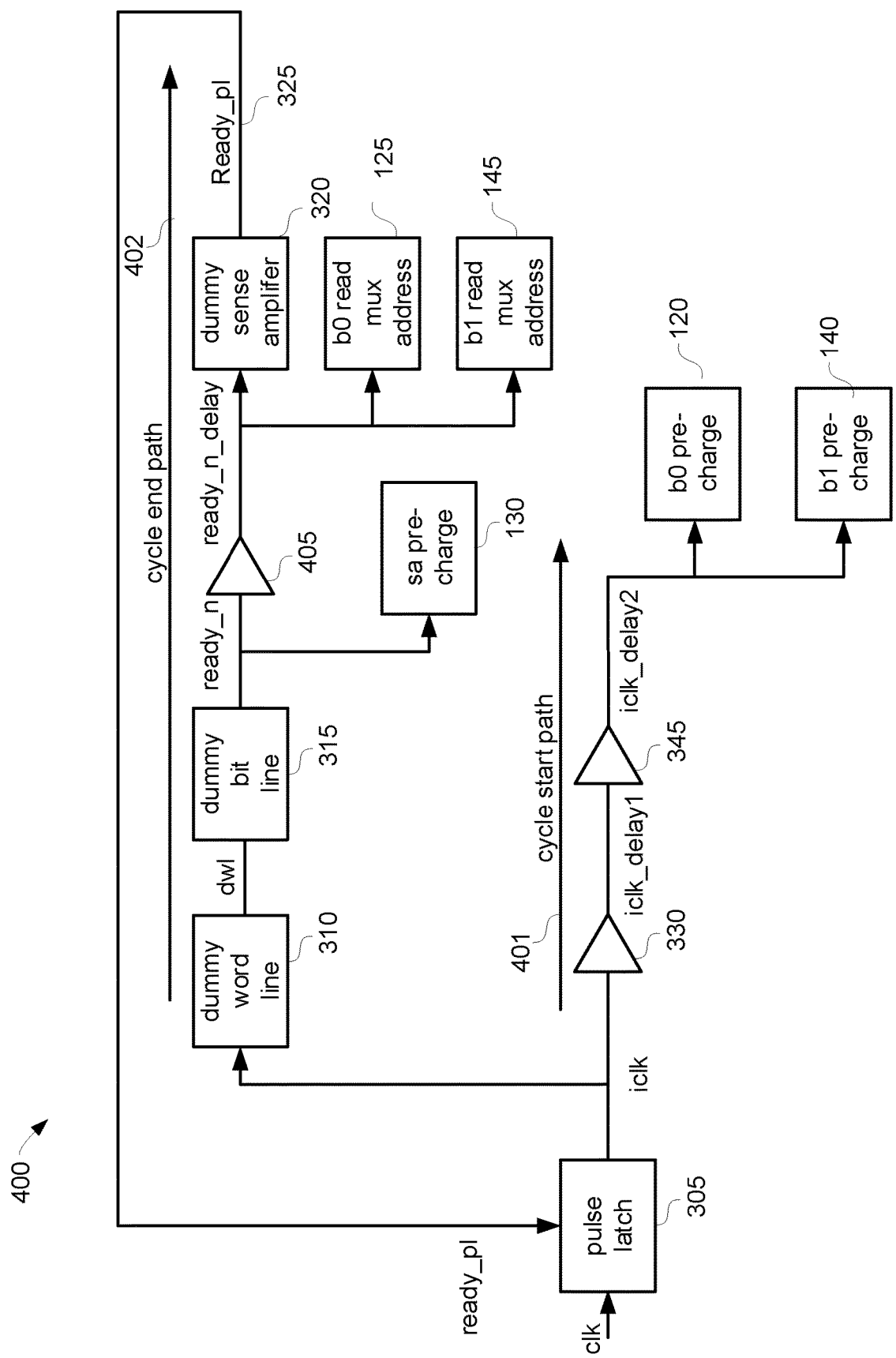
FIG. 4 illustrates a self-timed memory circuit for the self-timed memory of FIG. 1 in accordance with an aspect of the disclosure.

To address this timing deficiency, SRAM 100 may be timed by an improved self-timed memory circuit 400 illustrated in FIG. 4. As discussed with regard to self-timed memory circuit 300, pulse latch 305 responds to an assertion of the memory clock signal (clk) to assert and latch the iclk signal. Self-timed memory circuit 400 includes a cycle end path 402 that resets pulse latch 305 upon the completion of a successful sensing by sense amplifier 115 as modeled by dummy sense amplifier circuit 320. A cycle start path 401 controls the release of either the b0 pre-charge signal 120 or the b1 pre-charge signal 140, depending upon which bank is being addressed. In contrast to cycle start path 301, cycle start path 401 does not control the assertion of the b0 read mux address signal 125 or the assertion of the b1 read mux address signal 145. In addition, cycle start path 401 does not control the release (de-assertion) of the sa pre-charge signal 130.

As discussed for cycle start path 301, cycle start path 401 includes buffer 330 for delaying the iclk signal into the iclk_delay1 signal. In addition, cycle start path 401 includes buffer 345 for delaying the iclk_delay1 signal into the iclk_delay2 signal. After the delays produced by buffers 330 and 345 following the assertion of the iclk signal, the addressed one of the b0 pre-charge signal 120 and the b1 pre-charge signal 140 will be released.

In contrast to cycle end path 302, cycle end path 402 in self-timed memory circuit 400 controls the release of the sa pre-charge signal 130, the assertion of the b0 read multiplexer address signal 125, and the assertion of the b1 read multiplexer address signal 145. As discussed with regard to cycle end path 302, cycle end path 402 includes dummy word line circuit 310 that mimics the delay necessary to develop the word line voltage. In response to an assertion of the iclk signal, dummy word line circuit 310 will assert its dummy word line output signal (dw1) after the simulated word line voltage development delay. Dummy bit line circuit 315 mimics the bit line voltage difference development delay for the development of a sufficient bit line voltage difference in the addressed column. In response to an assertion of the dw1 output signal from dummy word line circuit 310, dummy bit line circuit 315 asserts its dummy word line output signal (ready_n) after the simulated bit line voltage difference development delay is completed. The assertion of the ready_n signal triggers a release of the sa pre-charge signal 130. The pre-charging of the sense amplifier input nodes q and qb will thus be stopped after the bit lines have developed a sufficient voltage difference for sense amplifier 115 to make a successful bit decision.

A buffer 405 delays the ready_n signal to form a ready_n_delay signal, which may also be denoted as a delayed dummy bit line output signal. An assertion of the ready_n_delay signal controls the assertion of the appropriate one of the b0 read mux address signal 125 and the b1 read mux address signal 145, depending upon which bank is being addressed in the read operation. The read multiplexer to the addressed bank will thus open and couple the pair of bit lines in the addressed column to the sense amplifier input nodes q and qb shortly after the pair of bit lines have developed a sufficient voltage difference for a bit decision. The delay provided by buffer 405 delays the assertion of b0 read mux address signal 125 or b1 read mux address signal 145 with respect to the release of the sa pre-charge signal 130. This delay may function to improve the sensing margin for sense amplifier 115.

Dummy sense amplifier circuit 320 responds to an assertion of the ready_n_delay signal by simulating the delay necessary to complete the bit decision by sense amplifier 115. After this simulated sense amplifier sensing delay, dummy sense amplifier circuit 320 asserts the ready_p1 signal 325 that causes pulse latch 305 to reset the internal clock signal iclk.

The internal clock signal iclk is not released in response to a falling edge of the memory clock signal clk. Instead, pulse latch 305 de-asserts the internal clock in response to the assertion of ready_p1 signal 325. The falling edge of the ready_n_delay signal triggers the dummy sense amplifier circuit 320 to simulate the sense amplifier sensing time. This falling edge also causes the se select signal 135 to be asserted. The sense amplifier input nodes q and qb are thus isolated from the bit lines until relatively late in the word line (w1) assertion period. Similarly, the sense amplifier pre-charging is only released until relatively late in the word line assertion period so that the sense amplifier input nodes q and qb may be properly recharged.

Figure 5:
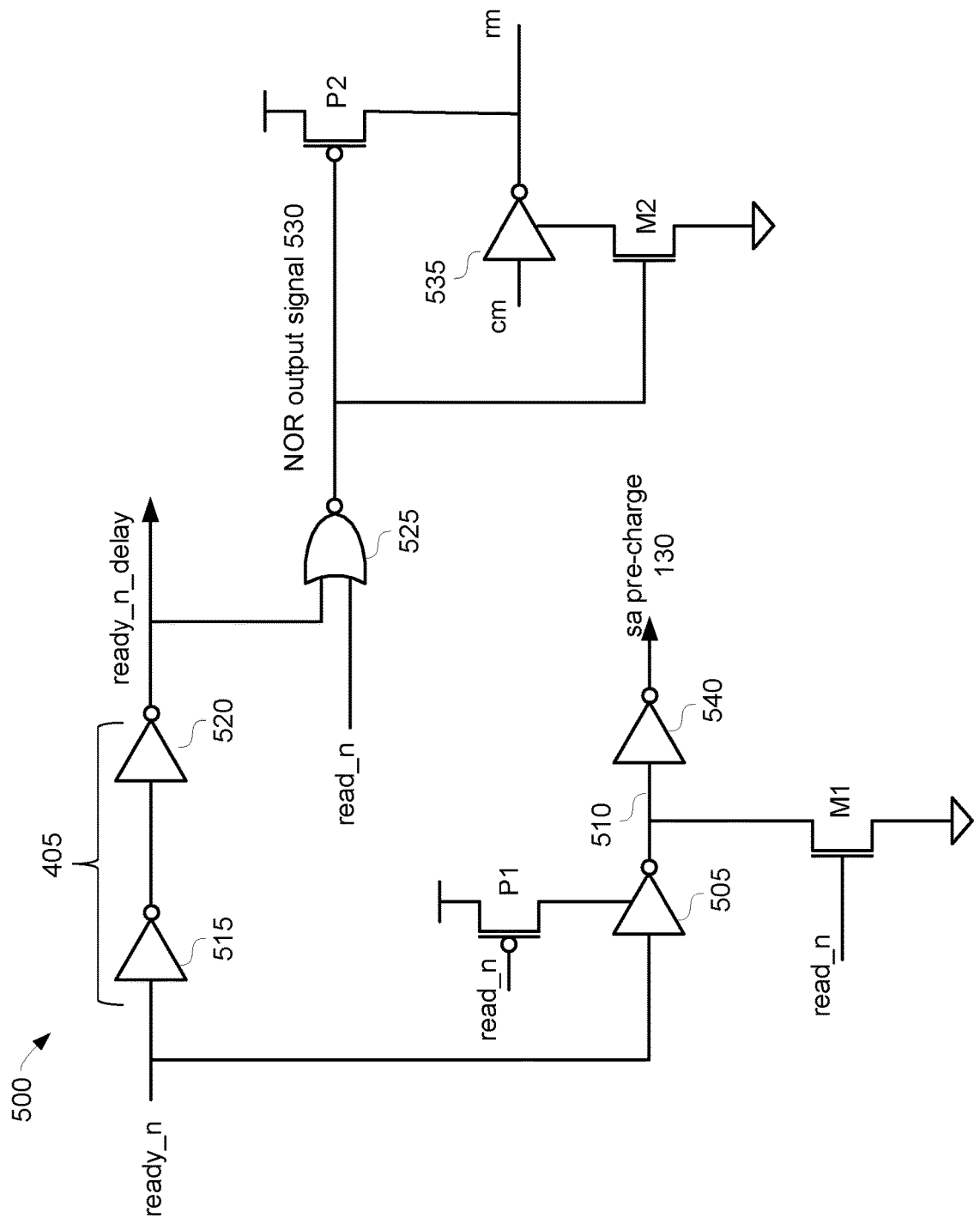
FIG. 5 illustrates a portion of the cycle end path in the self-timed memory circuit of FIG. 4 in accordance with an aspect of the disclosure.

A circuit diagram of a portion 500 of cycle end path 402 is shown in FIG. 5. An inverter 505 inverts the ready_n signal to drive an output node 510. A power supply node for inverter 505 couples to a power supply node through a p-type metal-oxide-semiconductor (PMOS) transistor P1. An active-low read_n signal controls a gate of transistor P1. Memory 100 asserts the read_n signal during a read operation. Inverter 505 is thus powered during a read operation because transistor P1 is conducting at that time. Output node 510 couples to ground through an n-type metal-oxide-semiconductor (NMOS) transistor M1, which also has its gate controlled by the read_n signal. Transistor M1 is thus off during a read operation since the read_n signal is asserted by being discharged. An inverter 540 inverts an inverted version of the ready_n signal on output node 510 during a read operation to release the sa pre-charge signal 130. Since the sa pre-charge signal in this implementation is an active-low signal, it is released or de-asserted by being charged to the power supply voltage.

Buffer 405 may be implemented by a pair of inverters 515 and 520 to delay the ready_n signal to form the ready_n_delay signal. A logic gate such as a NOR gate 525 NORs the ready_n_delay signal with the read_n signal to form a NOR output signal 530. A ground node of an inverter 535 couples to ground through an NMOS transistor M2 having its gate controlled by NOR output signal 530. Transistor M2 will be on so that inverter 535 functions when the NOR output signal 530 is asserted in response to an assertion of the ready_n_delay signal during a read operation.

Inverter 535 inverts an active-high column multiplexer signal cm to form a read multiplexer address signal rm while NOR output signal 530 is asserted. The read multiplexer address signal rm is generic to the b0 read mux address signal 125 during a read operation to the zeroth bank 103 and to the b1 read mux address signal 145 during a read operation to first bank 104. An output node of inverter 535 couples through a PMOS transistor P2 to a node for the power supply voltage. NOR output signal 530 drives a gate of transistor P2 so that the read multiplexer address signal rm is de-asserted (charged to the power supply voltage since it is an active-low signal) while the NOR output signal 530 is discharged. By keeping transistor P2 on until the NOR output signal 530 is asserted, self-timed memory circuit 400 functions to block the assertion of the b0 read mux address signal 125 or the assertion of the b1 read mux address signal 145 until the bit line voltage difference development delay is completed.

Figure 6:
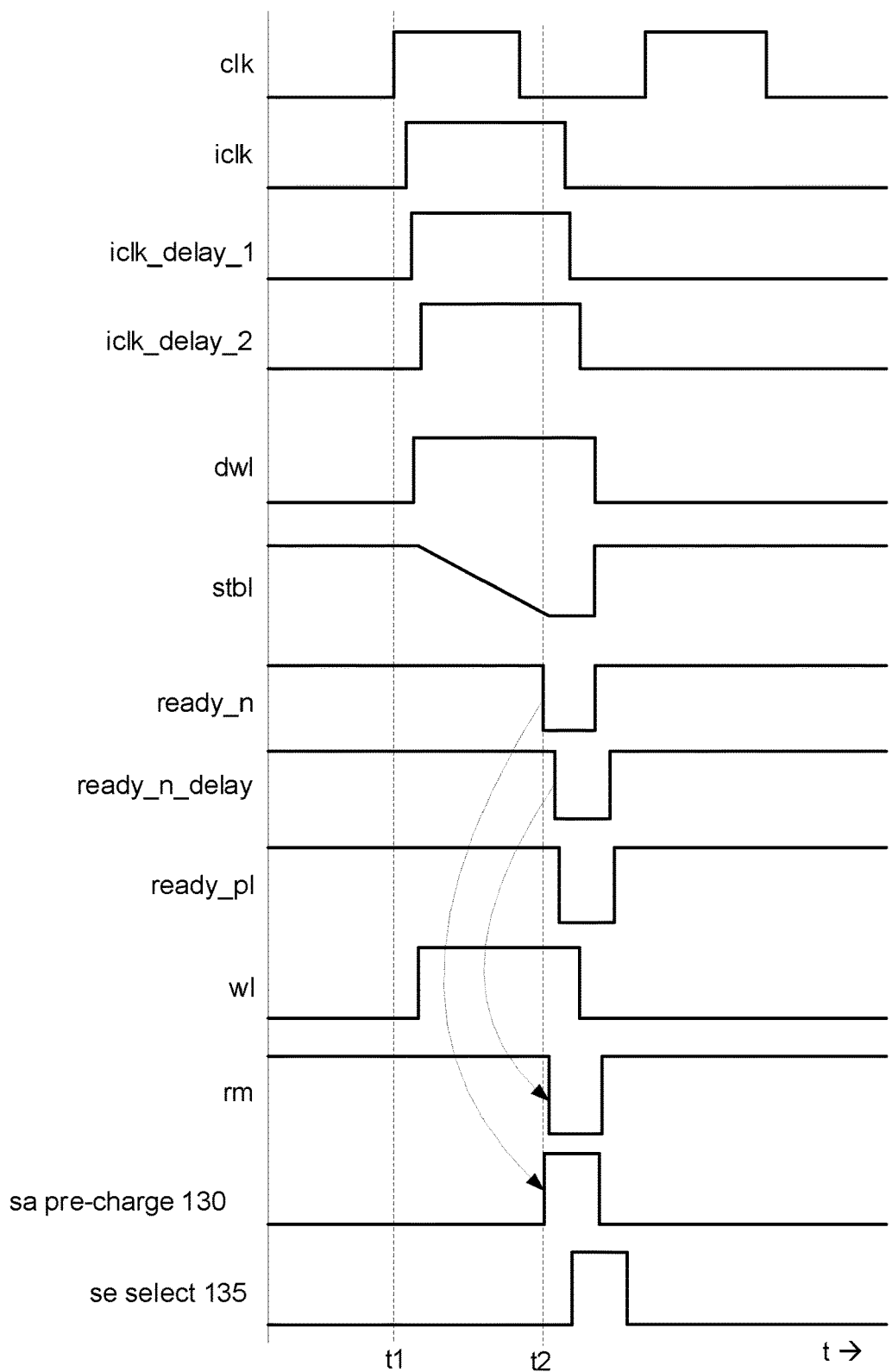
FIG. 6 illustrates some waveforms for the self-timed memory of FIG. 1 and the self-timed memory circuit of FIG. 4 in accordance with an aspect of the disclosure.

A timing diagram for various signals during operation of self-timed memory circuit 400 is shown in FIG. 6. A rising edge of the memory clock signal (clk) at a time t1 triggers pulse latch 305 to latch the iclk signal, which has a rising edge after the latching delay in pulse latch 305. The rising edge of the iclk signal causes the iclk_delay_1 signal to having a rising edge after the delay from buffer 330. Similarly, the rising edge of the iclk_delay_1 signal causes the iclk_delay_2 signal to have a rising edge after the delay from buffer 345. The rising edge of the iclk_delay_2 signal triggers the release of the appropriate one of the b0 pre-charge signal 120 or b1 pre-charge signal 140 (these pre-charge signals are not shown in FIG. 6).

The assertion of the iclk signal triggers dummy word line circuit 310 to assert the dw1 output signal after the simulation of the relatively-short delay for the word line voltage development. The assertion of the dw1 output signal causes the dummy bit line circuit 315 to begin modeling the bit line voltage difference development delay to develop a sufficient bit line voltage difference. This simulated delay is represented by the discharging of a signal stb1 to ground at a time t2, whereupon the ready_n signal is asserted by being discharged. This assertion of the ready_n signal causes the release (charging to the power supply voltage) of the sa pre-charge signal 130. After the brief delay from buffer 405 to assert the ready_n_delay signal following the assertion of the ready_n signal, the read multiplexer address signal rm is asserted by being discharged.

Figure 7:
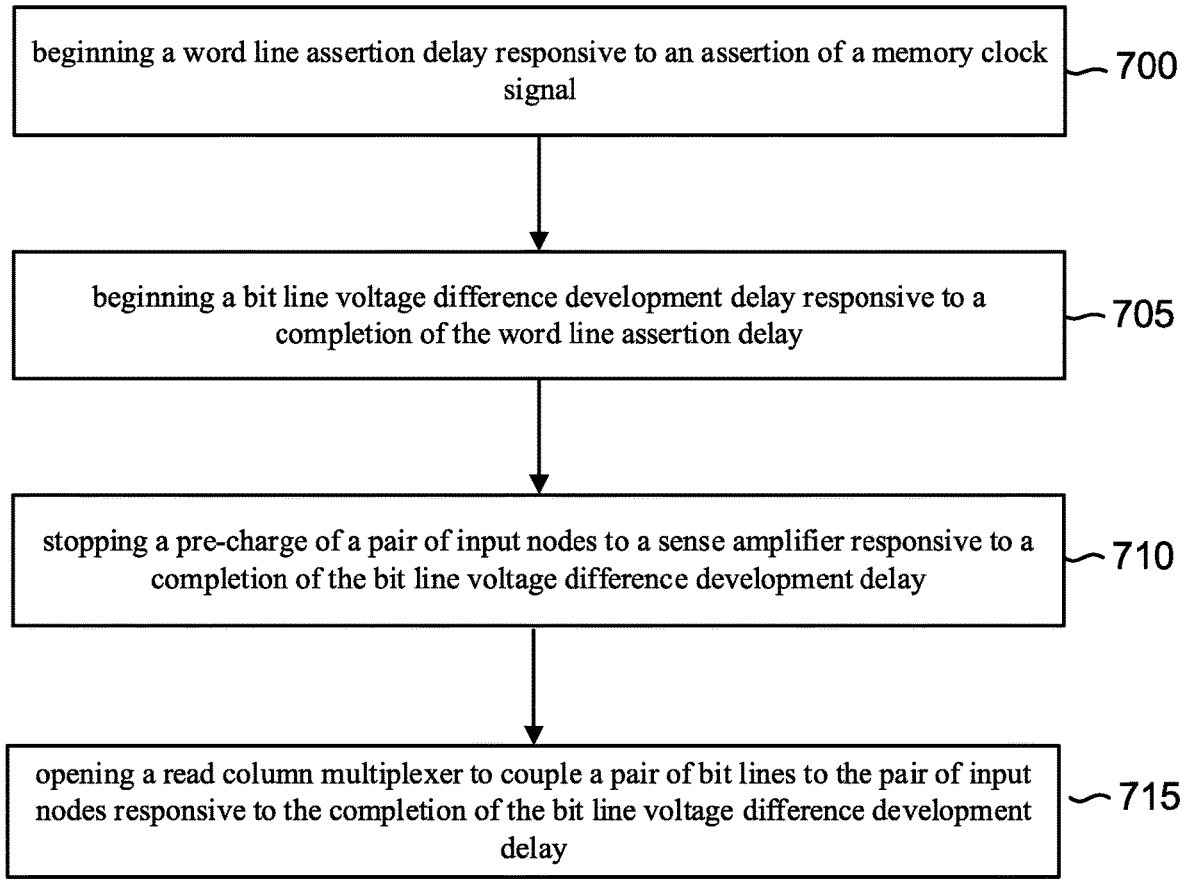
FIG. 7 is a flowchart of an example self-timed read operation in accordance with an aspect of the disclosure.

A method to perform a self-timed read operation to a memory will now be discussed with reference to the flowchart of FIG. 7. The method includes an act 700 of beginning a word line assertion delay responsive to an assertion of a memory clock signal. The beginning of the modeling of the word line assertion delay by dummy word line circuit 310 in self-timed memory circuit 400 is an example of act 700. The method further includes an act 705 of beginning a bit line voltage difference development delay responsive to a completion of the word line assertion delay. The beginning of the modeling of the bit line voltage difference development delay by dummy bit line circuit 315 responsive to the assertion of the dummy word line output signal dw1 in self-timed memory circuit 400 is an example of act 705. In addition, the method includes an act 710 of stopping a pre-charge of a pair of input nodes to a sense amplifier responsive to a completion of the bit line voltage difference development delay. The release of the sa pre-charge signal 130 by cycle end path 402 to stop the pre-charging of input nodes q and qb is an example of act 710. Finally, the method includes an act 715 of opening a read column multiplexer to couple a pair of bit lines to the pair of input nodes responsive to the completion of the bit line voltage difference development delay. The assertion of either b0 read mux address signal 125 to open column multiplexer 105 or the assertion of b1 read mux address signal 145 to open column multiplexer 110 is an example of act 715.

Figure 8:
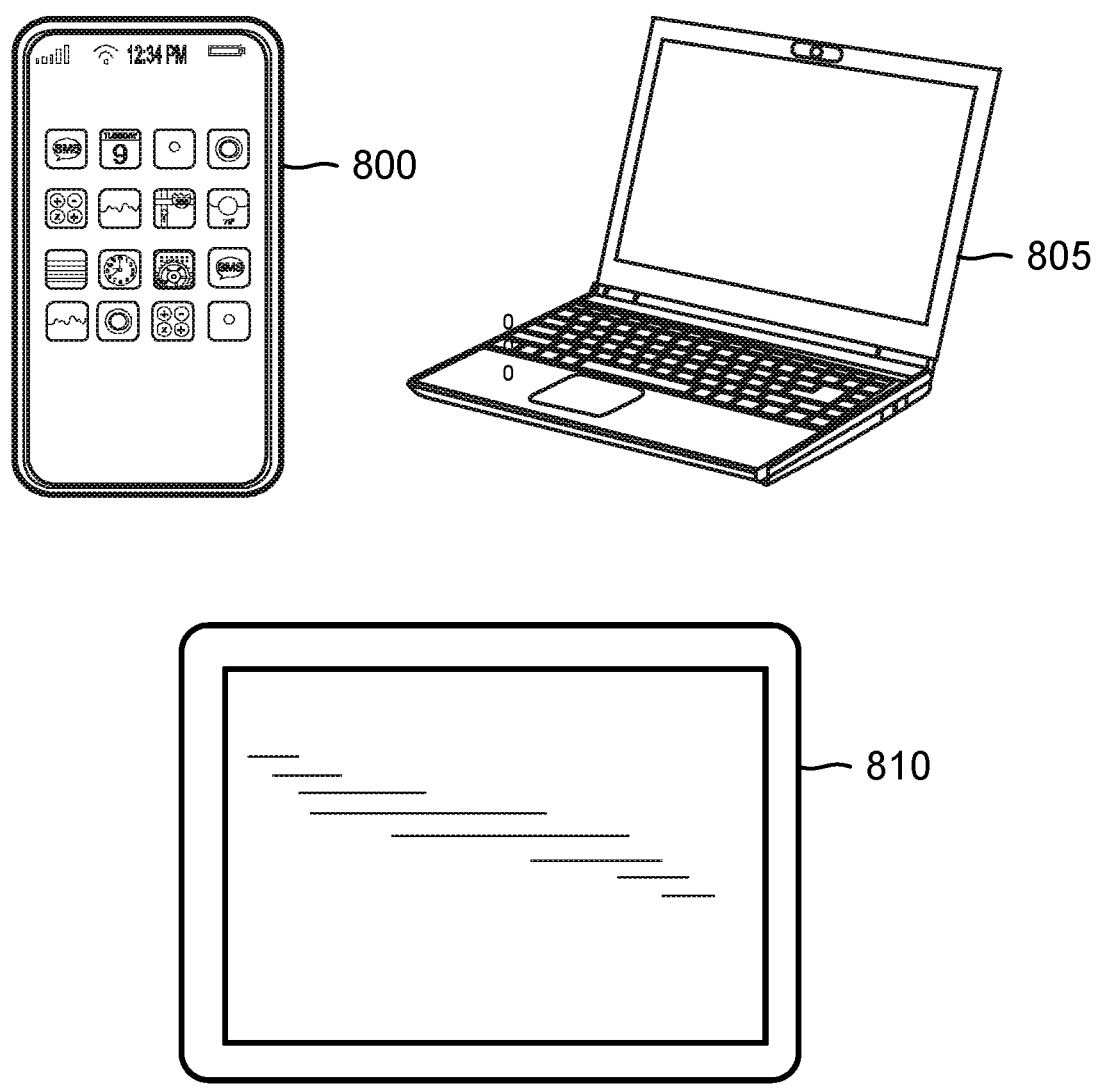
FIG. 8 illustrates some example electronic systems each incorporating a self-timed memory in accordance with an aspect of the disclosure.

A memory with the advantageous self-timing as disclosed herein may be incorporated into a wide variety of electronic systems. For example, as shown in FIG. 8, a cellular telephone 800, a laptop computer 805, and a tablet PC 810 may all include a memory with self-timing in accordance with the disclosure. Other exemplary electronic systems such as a music player, a video player, a communication device, and a personal computer may also be configured with memories constructed in accordance with the disclosure.

Some aspects of the disclosure will now be summarized in the following series of example clauses:

Clause 1. A memory, comprising:
a sense amplifier configured to pre-charge a pair of sense amplifier input nodes responsive to an assertion of a sense amplifier pre-charge signal; and
a self-timed memory circuit including a dummy bit line circuit configured to assert a dummy bit line output signal to trigger a de-assertion of the sense amplifier pre-charge signal.

Clause 2. The memory of clause 1, further comprising:
a first plurality of columns, each column in the first plurality of columns including a pair of bit lines;
a first read column multiplexer configured to select a first selected column from the first plurality of columns responsive to an assertion of a first read multiplexer address signal to couple the pair of bit lines in the first selected column to the pair of sense amplifier input nodes.

Clause 3. The memory of clause 2, wherein the self-timed memory circuit further includes:
a first switch coupled between a node for the first read multiplexer address signal and a power supply node, wherein the first switch is configured to open in response to the assertion of the dummy bit line output signal.

Clause 4. The memory of clause 3, wherein the self-timed memory circuit further includes:
a first buffer configured to delay the dummy bit line output signal into a delayed dummy bit line output signal, and
a first logic gate configured to process the delayed dummy bit line output signal into a first logic gate output signal, wherein the first switch is a first transistor having a gate coupled to the first logic gate output signal.

Clause 5. The memory of clause 4, wherein the first logic gate is a NOR gate and first transistor is a first p-type metal-oxide-semiconductor (PMOS) transistor.

Clause 6. The memory of any of clauses 4-5, wherein the self-timed memory circuit further includes:
a second logic gate configured to process a column multiplexer signal to produce the first read multiplexer address signal, the second logic gate including a ground terminal; and
a second switch coupled between the ground terminal and ground, wherein the second switch is configured to close responsive to an assertion of the first logic gate output signal.

Clause 7. The memory of clause 6, wherein the second logic gate comprises an inverter, and wherein the second switch comprises an n-type metal-oxide-semiconductor (NMOS) transistor having a gate coupled to the first logic gate output signal.

Clause 8. The memory of any of clauses 1-7, wherein the self-timed memory circuit further includes:
a buffer configured to delay the dummy bit line output signal to produce the sense amplifier pre-charge signal.

Clause 9. The memory of clause 8, wherein the buffer comprises:
a first inverter; and
a second inverter arranged in series with the first inverter.

Clause 10. The memory of clause 6, further comprising:
a second plurality of columns, each column in the second plurality of columns including a pair of bit lines;
a second read column multiplexer configured to select a second selected column from the second plurality of columns responsive to an assertion of a second read multiplexer address signal to couple the pair of bit lines in the second selected column to the pair of sense amplifier input nodes, wherein the node for the first read multiplexer address signal is also a node for the second read multiplexer address signal.

Clause 11. The memory of clause 10, further comprising:
a first bank including the first plurality of columns; and
a second bank including the second plurality of columns.

Clause 12. The memory of any of clause 2-11, wherein the self-timed memory circuit further includes:
a latch configured to latch a memory clock signal to provide an internal clock signal;
a dummy word line circuit configured to assert a dummy word line output signal responsive to an assertion of the internal clock signal, wherein the dummy bit line circuit is further configured to assert the dummy bit line signal responsive to an assertion of the dummy word line output signal.

Clause 13. The memory of clause 12, wherein the self-timed memory circuit further includes:
a first buffer configured to delay the internal clock signal to produce a first delayed internal clock signal; and
a second buffer configured to delay the first delayed internal clock signal to produce a second delayed internal clock signal, wherein each column in the first plurality of columns is configured to pre-charge its pair of bit lines responsive to a first binary state of the second delayed internal clock signal and to release a pre-charge of its pair of bit lines responsive to a second binary state of the second delayed internal clock signal.

Clause 14. The memory of any of clauses 1-13, wherein the memory is included in a cellular telephone.

Clause 15. A method of a read operation to a memory, comprising:
beginning a word line assertion delay responsive to an assertion of a memory clock signal;
beginning a bit line voltage difference development delay responsive to a completion of the word line assertion delay;
stopping a pre-charge of a pair of input nodes to a sense amplifier responsive to a completion of the bit line voltage difference development delay; and opening a read column multiplexer to couple a pair of bit lines to the pair of input nodes responsive to the completion of the bit line voltage difference development delay.

Clause 16. The method of clause 15, further comprising:
asserting a dummy bit line output signal upon the completion of the bit line voltage difference development delay;
buffering the dummy bit line output signal in a buffer to produce a delayed dummy bit line output signal; and
asserting a sense amplifier enable signal responsive to an assertion of the delayed dummy bit line output signal, wherein stopping the pre-charge of the pair of input nodes to the sense amplifier is responsive to the assertion of the dummy bit line output signal, and wherein opening the read column multiplexer to couple the pair of bit lines to the pair of input nodes is responsive to the assertion of the delayed dummy bit line output signal.

Clause 17. The method of clause 16, wherein beginning the word line assertion delay comprises modeling the word line assertion delay in a dummy word line circuit.

Clause 18. The method of any of clauses 16-17, further comprising:
latching the memory clock signal in a latch to provide an internal clock signal, wherein beginning the word line assertion delay is further responsive to an assertion of the internal clock signal.

Clause 19. The method of any of clauses 16-18, further comprising:
beginning the pre-charge of the pair of input nodes of the sense amplifier prior to the assertion of the memory clock signal.

Clause 20. The method of clause 18, further comprising:
delaying the internal clock signal to provide a delayed internal clock signal; and
stopping a pre-charge of the pair of bit lines responsive to an assertion of the delayed internal clock signal.

Clause 21. A memory comprising:
a plurality of columns, each column in the plurality of columns including a pair of bit lines;
a sense amplifier including a pair of sense amplifier input nodes;
a read column multiplexer configured to select a selected column from the plurality of columns responsive to an assertion of a read multiplexer address signal to couple the pair of bit lines in the selected column to the pair of sense amplifier input nodes; and
a self-timed memory circuit configured to prevent the assertion of the read multiplexer address signal until a completion of a bit line voltage difference development delay.

Clause 22. The memory of clause 21, wherein the self-timed memory circuit includes:
a latch configured to latch a memory clock signal to provide an internal clock signal; and
a dummy bit line circuit configured to determine the completion of the bit line voltage difference development delay responsive to an assertion of the internal clock signal, wherein the self-timed memory circuit is further configured to reset the latch to reset the internal clock signal responsive to a completion of a sensing by the sense amplifier.

Clause 23. The memory of clause 22, further comprising:
a dummy word line circuit, wherein the dummy bit line circuit is further configured to determine the completion of the bit line voltage difference development delay responsive to an assertion of a dummy word line output signal from the dummy word line circuit.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A memory, comprising;
a sense amplifier configured to pre-charge a pair of sense amplifier input nodes responsive to an assertion of a sense amplifier pre-charge signal;
a self-timed memory circuit including a dummy bit line circuit configured to assert a dummy bit line output signal to trigger a de-assertion of the sense amplifier pre-charge signal;
a first plurality of columns, each column in the first plurality of columns including a pair of bit lines;
a first read column multiplexer configured to select a first selected column from the first plurality of columns responsive to an assertion of a first read multiplexer address signal to couple the pair of bit lines in the first selected column to the pair of sense amplifier input nodes; and
a first switch coupled between a node for the first read multiplexer address signal and a power supply node, wherein the first switch is configured to open in response to the assertion of the dummy bit line output signal.

2. The memory of claim 1, wherein the self-timed memory circuit further includes:
a first buffer configured to delay the dummy bit line output signal into a delayed dummy bit line output signal, and
a first logic gate configured to process the delayed dummy bit line output signal into a first logic gate output signal, wherein the first switch is a first transistor having a gate coupled to the first logic gate output signal.

3. The memory of claim 2, wherein the first logic gate is a NOR gate and first transistor is a first p-type metal-oxide-semiconductor (PMOS) transistor.

4. The memory of claim 2, wherein the self-timed memory circuit further includes:
a second logic gate configured to process a column multiplexer signal to produce the first read multiplexer address signal, the second logic gate including a ground terminal; and
a second switch coupled between the ground terminal and ground, wherein the second switch is configured to close responsive to an assertion of the first logic gate output signal.

5. The memory of claim 4, wherein the second logic gate comprises an inverter, and wherein the second switch comprises an n-type metal-oxide-semiconductor (NMOS) transistor having a gate coupled to the first logic gate output signal.

6. The memory of claim 4, further comprising:
a second plurality of columns, each column in the second plurality of columns including a pair of bit lines; and
a second read column multiplexer configured to select a second selected column from the second plurality of columns responsive to an assertion of a second read multiplexer address signal to couple the pair of bit lines in the second selected column to the pair of sense amplifier input nodes, wherein the node for the first read multiplexer address signal is also a node for the second read multiplexer address signal.

7. The memory of claim 6, further comprising:
a first bank including the first plurality of columns; and
a second bank including the second plurality of columns.

8. The memory of claim 1, wherein the self-timed memory circuit further includes:
- a latch configured to latch a memory clock signal to produce an internal clock signal; and
- a dummy word line circuit configured to assert a dummy word line output signal responsive to an assertion of the internal clock signal, wherein the dummy bit line circuit is further configured to assert the dummy bit line signal responsive to an assertion of the dummy word line output signal.

9. The memory of claim 8, wherein the self-timed memory circuit further includes:
- a first buffer configured to delay the internal clock signal to produce a first delayed internal clock signal; and
- a second buffer configured to delay the first delayed internal clock signal to produce a second delayed internal clock signal, wherein each column in the first plurality of columns is configured to pre-charge its pair of bit lines responsive to a first binary state of the second delayed internal clock signal and to release a pre-charge of its pair of bit lines responsive to a second binary state of the second delayed internal clock signal.

10. The memory of claim 1, wherein the self-timed memory circuit further includes:
- a buffer configured to delay the dummy bit line output signal to produce the sense amplifier pre-charge signal.

11. The memory of claim 10, wherein the buffer comprises:
- a first inverter; and
- a second inverter arranged in series with the first inverter.

12. The memory of claim 1, wherein the memory is included in a cellular telephone.

13. A memory comprising:
- a plurality of columns, each column in the plurality of columns including a pair of bit lines;
- a sense amplifier including a pair of sense amplifier input nodes;
- a read column multiplexer configured to select a selected column from the plurality of columns responsive to an assertion of a read multiplexer address signal to couple the pair of bit lines in the selected column to the pair of sense amplifier input nodes;
- a self-timed memory circuit including a dummy bit line circuit configured to prevent the assertion of the read multiplexer address signal until an assertion of a dummy bit line circuit output signal; and
- a first switch coupled between a node for the read multiplexer address signal and a power supply node, wherein the first switch is configured to open in response to the assertion of the dummy bit line circuit output signal.

14. The memory of claim 13, wherein the self-timed memory circuit includes:
- a latch configured to latch a memory clock signal to provide an internal clock signal; and
- a dummy word line circuit configured to assert a dummy word line output signal responsive to an assertion of the internal clock signal, wherein the self-timed memory circuit is further configured to reset the latch to reset the internal clock signal responsive to a completion of a sensing by the sense amplifier.

15. The memory of claim 14, wherein the self-timed memory circuit further includes:
- a buffer configured to delay the dummy bit line circuit output signal to produce a delayed dummy bit line circuit output signal, wherein the self-timed memory circuit is further configured to assert the read multiplexer address signal responsive to an assertion of the delayed dummy bit line circuit output signal.

* * * * *